(12) United States Patent
de Frésart et al.

(10) Patent No.: US 6,593,199 B1
(45) Date of Patent: Jul. 15, 2003

(54) METHOD OF MANUFACTURING A SEMICONDUCTOR COMPONENT AND SEMICONDUCTOR COMPONENT THEREOF

(75) Inventors: Edouard de Frésart, Tempe, AZ (US); John W. Steele, Chandler, AZ (US); David Theodore, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/086,079

(22) Filed: Feb. 27, 2002

(51) Int. Cl.⁷ .................................................. H01L 21/331

(52) U.S. Cl. ....................................... 438/357; 438/222

(58) Field of Search ................................. 438/222, 226, 438/360, 357, 363, 369, 358, 510, 505, 514, 495, 767, 779, 914

(56) References Cited

U.S. PATENT DOCUMENTS

| | | | | |
|---|---|---|---|---|
| 4,895,810 A | * | 1/1990 | Meyer et al. | 431/41 |
| 5,262,336 A | * | 11/1993 | Pike et al. | 257/142 |
| 6,110,842 A | * | 8/2000 | Okuno et al. | 438/776 |

* cited by examiner

*Primary Examiner*—David Nelms
*Assistant Examiner*—David Nhu
(74) *Attorney, Agent, or Firm*—Bryan Cave LLP

(57) ABSTRACT

A method of manufacturing a semiconductor component includes providing a substrate (110) having a first doping concentration and growing an epitaxial layer (120, 520) over the substrate. The epitaxial layer has a second doping concentration lower than the first doping concentration, and the epitaxial layer has at least two effective, as-grown thicknesses. The resulting composite substrate is suitable for an integrated circuit having both high and low voltage portions.

29 Claims, 3 Drawing Sheets

METHOD OF MANUFACTURING A SEMICONDUCTOR COMPONENT AND SEMICONDUCTOR COMPONENT THEREOF

FIELD OF THE INVENTION

This invention relates to electronics, in general, and to methods of manufacturing semiconductor components and semiconductor components thereof, in particular.

BACKGROUND OF THE INVENTION

In deep-sub-micron semiconductor technologies, minority carrier injection can be a major problem because of its detrimental effects on shifting the threshold voltages for Field Effect Transistors (FETs) and on increasing the occurrence of transistor latch-up. To eliminate this problem, some deep sub-micron semiconductor technologies use a heavily doped substrate underneath a thin, lightly doped epitaxial layer. The heavily doped substrate significantly reduces the minority carrier lifetime and transistor latch-up, while the lightly doped epitaxial layer is used to build the semiconductor devices.

The small thickness of the epitaxial layer, however, introduces a new problem due to the out-diffusion of the dopant from the underlying, heavily doped substrate into the overlying, lightly doped epitaxial layer, which reduces the effective thickness of the epitaxial layer. Consequently, a high voltage portion of an integrated circuit manufactured in the epitaxial layer has poor electrical performance because of its low breakdown voltage resulting from the excessively small effective thickness of the epitaxial layer. The use of a thicker epitaxial layer to solve this problem increases the problems of minority carrier propagation and transistor latch-up and also increases the risk of high levels of leakage current because of the implant-induced defects in the thicker epitaxial layer resulting from the higher energy implants needed to dope the thicker epitaxial layer.

One technique proposed to solve the problem includes growing a thicker epitaxial layer, and then selectively etching the thicker epitaxial layer to reduce its thickness in an area in which the low voltage portion of the integrated circuit is to be located. However, this selective etch process is not manufacturable in most circumstances due to manufacturing yield problems. Another proposed solution includes selective epitaxial growth, but this, too, is not manufacturable in most circumstances due to manufacturing yield problems.

Accordingly, a need exists for a method of manufacturing a semiconductor component that is compatible with deep sub-micron semiconductor technologies, that has reduced transistor latch-up, and that also has reduced minority carrier lifetimes. A need also exists for a semiconductor component having these qualities.

BRIEF DESCRIPTION OF THE DRAWINGS

The invention will be better understood from a reading of the following detailed description, taken in conjunction with the accompanying figures in the drawings in which.

Figure 1:
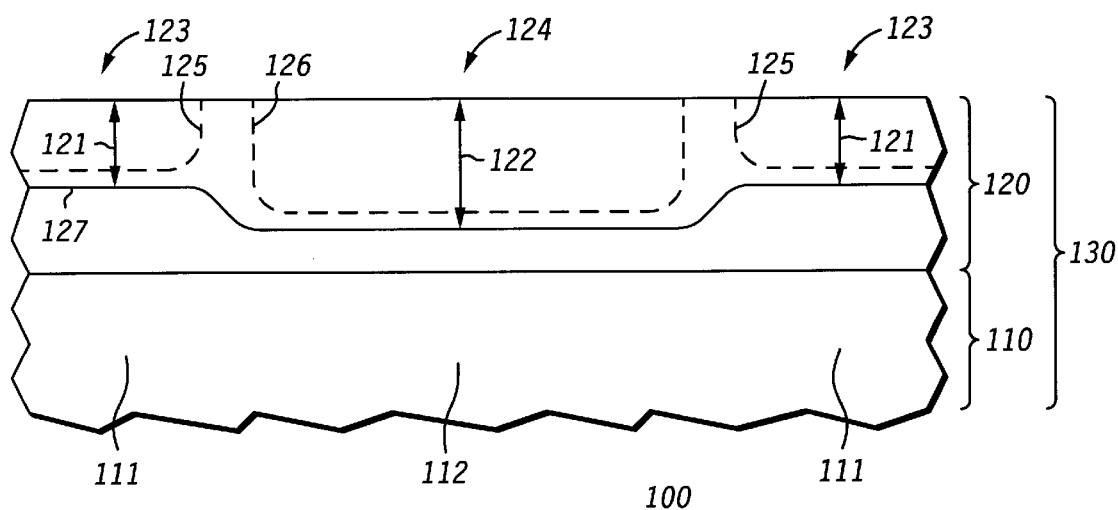
FIG. 1 illustrates a cross-sectional view of a semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

In accordance with an embodiment of the invention, a semiconductor component can be formed in an epitaxial layer overlying a substrate. The available or effective thickness of the epitaxial layer can be selectively increased by adjusting a diffusion rate of a dopant, or by adjusting an aggregate diffusion rate of two or more dopants, from a portion of the substrate into a portion of the epitaxial layer. As an example, the diffusion rate can be increased by increasing the interstitial defects and/or vacancies in the epitaxial layer, by increasing the dopant concentration in the substrate in some cases, and/or by introducing an additional dopant into the substrate where the additional dopant has a faster diffusion rate than the original substrate dopant. As another example, the diffusion rate can be decreased by decreasing the interstitial defects and/or vacancies in the substrate, or by using a diffusion barrier between the substrate and the epitaxial layer.

FIG. 1 illustrates a cross-sectional view of a semiconductor component 100. Semiconductor component 100 comprises a substrate 110. As an example, substrate 110 can be a semiconductor substrate comprised of silicon, gallium arsenide, or the like. Substrate 110 can include one or more epitaxial layers.

Substrate 110 is provided with a doping concentration of a dopant. As an example, substrate 110 can have a doping concentration of a P-type dopant of greater than approximately $1 \times 10^{18}$ atoms per centimeter cubed. Accordingly, substrate 110 can be referred to as a P++ substrate. Substrate 110 can have this doping concentration before being inserted into a chamber, as explained below. In one embodiment, substrate 110 can be a silicon substrate with a boron doping concentration of approximately $1 \times 10^{18}$ atoms per centimeter cubed to $1 \times 10^{19}$ atoms per centimeter cubed.

Semiconductor component 100 also comprises an epitaxial layer 120 overlying substrate 110. Epitaxial layer 120 and substrate 110 form a composite substrate 130. To form epitaxial layer 120, substrate 110 can be positioned or otherwise inserted into a chamber. The chamber can be, for example, a growth chamber of an epitaxial reactor. After substrate 110 is inside the chamber, epitaxial layer 120 is grown over substrate 110 to form composite substrate 130 in the chamber.

Epitaxial layer 120 is provided with a doping concentration of a dopant. In one embodiment, epitaxial layer 120 and substrate 110 have the same doping type. As an example, epitaxial layer 120 can have a doping concentration of a P-type dopant of less than approximately $1 \times 10^{17}$ atoms per centimeter cubed. Accordingly, the doping concentration of epitaxial layer 120 can be lower than that of substrate 110. Epitaxial layer 120 can have its doping concentration before removing composite substrate 130 from the chamber. Accordingly, the doping concentration of epitaxial layer 120 can be referred to as an as-grown doping concentration. The dopant in epitaxial layer 120 can be the same dopant or a different dopant as that in substrate 110.

During the formation of epitaxial layer 120, the dopant from substrate 110 is diffused from substrate 110 into epitaxial layer 120 when the doping concentration of substrate 110 is greater than the doping concentration of epitaxial layer 120. This diffusion increases the doping concentration with in a portion of epitaxial layer 120 and reduces the usable or effective thickness of epitaxial layer 120. As an example, the dopant diffused from substrate 110 into epitaxial layer 120 can have previously provided the earlier-described doping concentration for substrate 110.

As explained in more detailed hereinafter, the diffusion rate of the dopant for at least one portion of substrate 110 is changed, adjusted, or modified to provide epitaxial layer 120 with at least two effective thicknesses. A first one of the at least two effective thicknesses can be greater than a second one of the at least two effective thicknesses. The total thickness of epitaxial layer 120 is greater than any of the effective thicknesses. As an example, epitaxial layer 120 can have the different effective thicknesses before removing composite substrate 130 from the chamber. Accordingly, the effective thicknesses can be referred to as as-grown effective thicknesses. In some embodiments, the diffusion rate adjustment can also be maintained during high temperature steps occurring after growing epitaxial layer 120.

As an example, epitaxial layer 120 can have a total thickness of approximately two to five micrometers. In one embodiment where epitaxial layer 120 has a total thickness of approximately three to five micrometers, a section 123 of epitaxial layer 120 can have an effective thickness 121 of approximately one to two micrometers before removing composite substrate 130 from the chamber, and a section 124 of epitaxial layer 120 can have an effective thickness 122 of approximately two to three micrometers before removing composite substrate 130 from the chamber. Thicknesses 121 and 122 are identified by the arrows in FIG. 1 from a top surface of epitaxial layer 120 to a solid line 127 in epitaxial layer 120. Section 123 of epitaxial layer 120 is located over a portion 111 of substrate 110, and section 124 of epitaxial layer 120 is located over a portion 112 of substrate 110.

After forming epitaxial layer 120 over substrate 110, composite substrate 130 is removed from the chamber. Next, a portion 125 of an integrated circuit is formed in section 123 of epitaxial layer 120, and a portion 126 of the integrated circuit is formed in section 124 of epitaxial layer 120. In one embodiment, portion 125 is a low voltage circuit comprised of one or more Complimentary Metal-Oxide-Semiconductor (CMOS) FETs, and portion 126 is a high voltage circuit comprised of one or more high voltage bipolar transistors and/or FETs. Accordingly, portion 126 of the integrated circuit is a higher voltage portion than portion 125 of the integrated circuit. The smaller effective thickness of section 123 of epitaxial layer 120 provides the anti-latch-up properties and reduces the minority carrier lifetimes for portion 125 of the integrated circuit. The larger effective thickness of section 124 of epitaxial layer 120 increases the sustaining voltage for portion 126 of the integrated circuit. As an example, portions 125 and 126 of the integrated circuit can be formed simultaneously with each other.

As indicated earlier, the diffusion rate of the dopant from substrate 110 into epitaxial layer 120 can be changed, adjusted, or modified. In some embodiments, the diffusion rate from a portion of substrate 110 into an overlying portion of epitaxial layer 120 can be retarded, reduced, impeded, or otherwise decreased while growing the epitaxial layer. This decrease in diffusion rate increases the effective, as-grown thickness of the overlying portion of epitaxial layer 120. Also in this embodiment, the diffusion rate from a different portion of substrate 110 into a different overlying portion of epitaxial layer 120 can remain the same and is not decreased.

Figure 2:
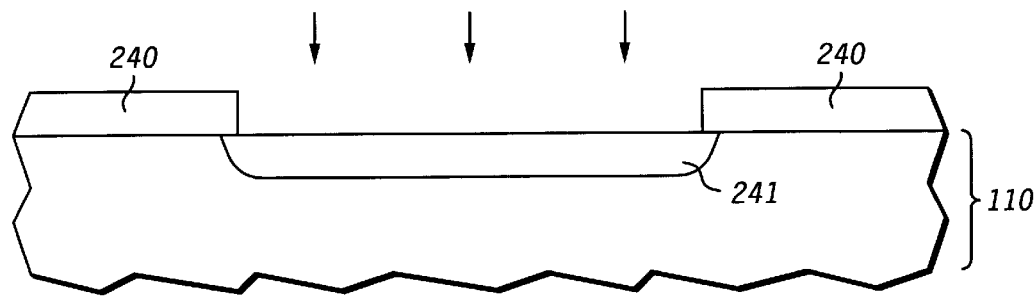
FIG. 2 illustrates a cross-sectional view of the semiconductor component of FIG. 1 during a manufacturing step, in accordance with an embodiment the invention.

FIG. 2 illustrates a cross-sectional view of an embodiment of the semiconductor component of FIG. 1 during a manufacturing step used to decrease the diffusion from an underlying substrate into an overlying epitaxial layer. In the embodiment illustrated in FIG. 2, a species is implanted into a portion 241 of substrate 110. An implant mask 240 can be used to shield other portions of substrate 110 and to block or otherwise prevent the species from being implanted into these other portions of substrate 110. As an example, this implanting step can occur before inserting substrate 110 into the chamber and also before growing epitaxial layer 120 (FIG. 1).

As an example, the specific species implanted into substrate 110 should decrease the diffusion of the dopant in substrate 110. More than one species can be used for the purposes of decreasing the diffusion of the dopant. The implant dose for the species can be up to its solid solubility within substrate 110. In this embodiment, the implant does not amorphize the surface of substrate 110.

The implanted species can be used to reduce the diffusion of the dopant from a portion of substrate 110 underneath portion 241 into an overlying portion of epitaxial layer 120 (FIG. 1). More specifically, the species can be implanted into portion 241 to reduce the interstitials and/or vacancies in portion 241 of substrate 110, which reduces the diffusion rate of the dopant out of or through portion 241.

In one embodiment, substrate 110 and subsequently formed epitaxial layer 120 (FIG. 1) are comprised of silicon;

the dopant in substrate 110 and subsequently formed epitaxial layer 120 (FIG. 1) is boron; and the implanted species is carbon. As an example, a carbon implant dose of approximately $1\times10^{14}$ to $1\times10^{15}$ atoms per centimeter squared and a carbon implant energy of approximately twenty-five to thirty-five kiloelectron Volts (keV) can be used, and the carbon can be implanted up to a concentration of approximately 0.1 percent by weight in substrate 110. Computer simulations show higher carbon fractions further reduce the boron diffusion rate, and deeper carbon layer implants also further reduce the boron diffusion rate. In the past, carbon is rarely implanted into silicon, and if it is, it is used to reduce minority carrier lifetimes, and not diffusion rates. In other embodiments, the implanted species can be germanium (if less than eight percent by weight of substrate 110), beryllium, nitrogen, lithium, calcium, sodium, and/or fluorine.

After implanting the species, implant mask 240 is removed, epitaxial layer 120 (FIG. 1) is formed over substrate 110 such that section 124 of epitaxial layer 120 (FIG. 2) is formed over portion 241 of substrate 110, and section 123 of epitaxial layer 120 (FIG. 2) is formed over other portions of substrate 110.

Figure 3:
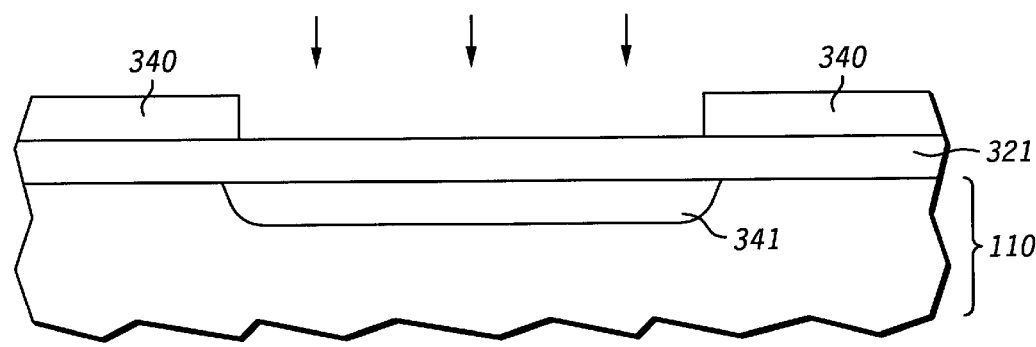
FIG. 3 illustrates a cross-sectional view of the semiconductor component of FIG. 1 during a manufacturing step, in accordance with another embodiment of the invention.

FIG. 3 illustrates a cross-sectional view of another embodiment of the semiconductor component of FIG. 1 during a manufacturing step used to decrease the diffusion from an underlying substrate into an overlying epitaxial layer. In the embodiment illustrated in FIG. 3, a species is implanted into a portion 341 of substrate 110 after growing a portion 321 of a total thickness of epitaxial layer 120 (FIG. 1). The species is implanted through an unmasked portion of portion 321 of epitaxial layer 120 (FIG. 1). An implant mask 340 can be used to block, shield, or otherwise prevent the species from being implanted through masked portions of portion 321 of epitaxial layer 120 (FIG. 1) and also to block or otherwise prevent the species from being implanted into underlying portions of substrate 110.

In one embodiment, substrate 110 and epitaxial layer 120 (FIG. 1) can each be comprised of silicon and doped with boron, and the implanted species can be carbon. As an example, the species can be implanted with an implant energy of approximately two to five Megaelectron Volts (MeV) such that the crystalline structure of portion 321 of epitaxial layer 120 (FIG. 1) is not destroyed and remains substantially epitaxial. In this embodiment, an additional portion of the total thickness of epitaxial layer 120 (FIG. 1) can be properly grown with a crystalline structure after implanting the species and removing implant mask 340. Accordingly, section 124 of epitaxial layer 120 (FIG. 1) is formed over portion 341 (FIG. 3) of substrate 110, and section 123 of epitaxial layer 120 (FIG. 1) is formed over other portions of substrate 110.

As a variation to this embodiment, the implanted species can be used to amorphize or destroy the crystalline structure of portion 341 (FIG. 3) of substrate 110. In this embodiment, at least the surface of portion 341 of substrate 110 is amorphized. Also in this embodiment, the crystalline structure of portion 321 of epitaxial layer 120 (FIG. 1) is not destroyed and remains substantially epitaxial. The non-crystalline structure of portion 341 of substrate 110 reduces the diffusion of the dopant from substrate 110 into epitaxial layer 120 (FIG. 1) while growing the additional portion of the total thickness of epitaxial layer 120.

Figure 4:
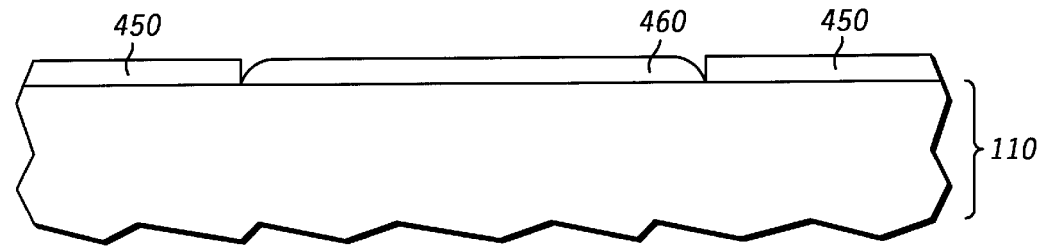
FIG. 4 illustrates a cross-sectional view of another semiconductor component after a manufacturing step, in accordance with a further embodiment of the invention.

FIG. 4 illustrates a cross-sectional view of a semiconductor component 400 after a manufacturing step used to decrease the diffusion from an underlying substrate into an overlying epitaxial layer. In this embodiment, an epitaxy mask 450 is formed over substrate 110, and a diffusion barrier 460 is formed over a portion of substrate 10. As an example, diffusion barrier 460 can be an epitaxial layer and can have a crystalline structure. Diffusion barrier 460 is used to reduce the diffusion of dopant from a portion of substrate 110 located under diffusion barrier 460 into the portion of the subsequently formed epitaxial layer located over diffusion barrier 460.

As an example, substrate 10 can be comprised of silicon, and diffusion barrier 460 can be comprised of a silicon germanium and carbon epitaxial layer. More specifically, a ten to one ratio of silicon germanium to carbon can be used for diffusion barrier 460 such that diffuision barrier 460 comprises less than three percent by weight of carbon relative to silicon and less than thirty percent by weight of germanium relative to silicon. Diffusion barrier 460 can have a thickness of approximately 0.2 to 0.5 micrometers.

Figure 5:
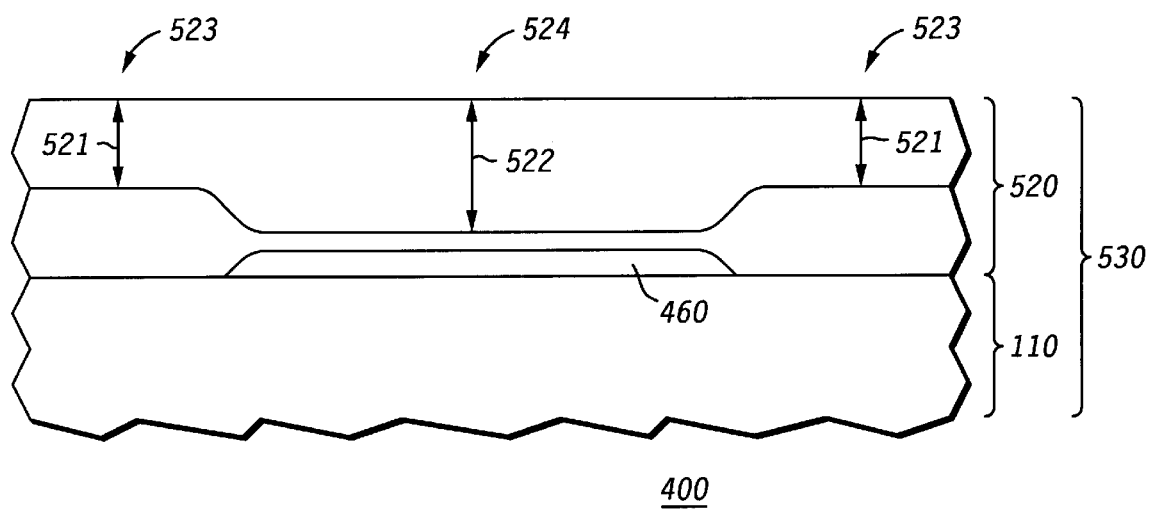
FIG. 5 illustrates a cross-sectional view of the semiconductor component of FIG. 4 after a subsequent manufacturing step, in accordance with the further embodiment of the invention.

FIG. 5 illustrates a cross-sectional view of semiconductor component 400 after a subsequent manufacturing step. After the formation of diffusion barrier 460, epitaxy mask 450 is removed, and epitaxial layer 520 is formed. Epitaxial layer 520 in FIG. 5 is similar to epitaxial layer 120 in FIG. 1. For example, epitaxial layer 520 has at least two sections 523 and 524, each with its own effective, as-grown thickness 521 and 522, respectively. Effective thickness 522 is greater than effective thickness 521 due to the use of diffusion barrier 460. Substrate 110 and epitaxial layer 520 form a composite substrate 530.

In addition to decreasing the diffusion rate of a dopant from the substrate into the epitaxial layer, the diffusion rate of a dopant from substrate 110 into epitaxial layer 120 can also be increased. In some embodiments, the diffusion rate from a portion of substrate 110 into an overlying portion of epitaxial layer 120 can be accelerated, enhanced, assisted, facilitated, or otherwise increased while growing the epitaxial layer. This increase in diffusion rate reduces the effective, as-grown thickness of the overlying portion of epitaxial layer 120. Also in this embodiment, the diffusion rate from a different portion of substrate 110 into a different overlying portion of epitaxial layer 120 can remain the same and is not increased.

Figure 6:
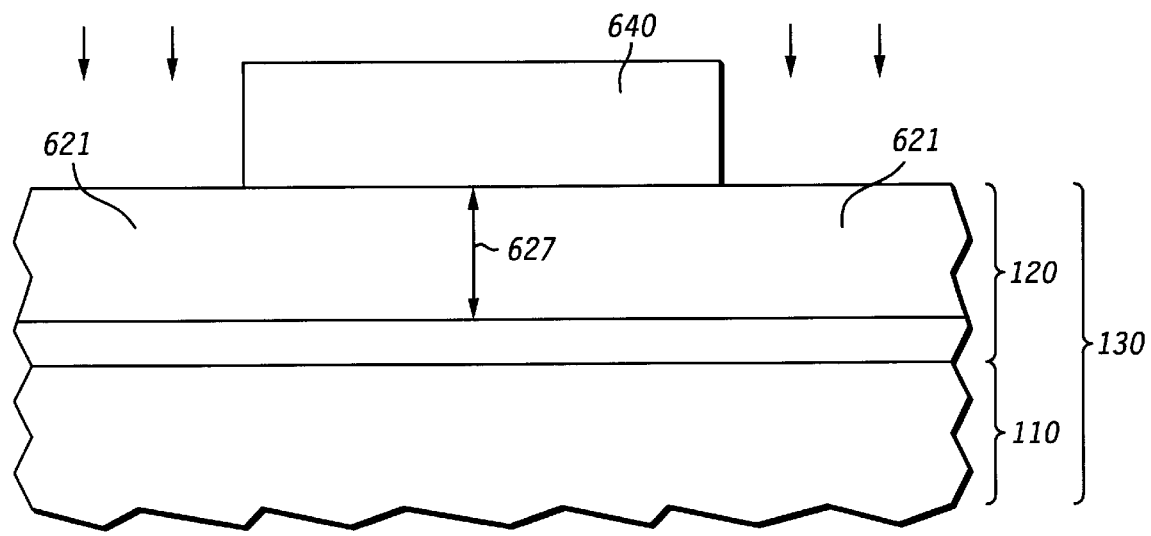
FIG. 6 illustrates a cross-sectional view of the semiconductor component of FIG. 1 during a manufacturing step, in accordance with still another embodiment of the invention.

FIG. 6 illustrates a cross-sectional view of still another embodiment of the semiconductor component of FIG. 1 during a manufacturing step used to increase the diffusion from an underlying substrate into an overlying epitaxial layer. In contrast to previous embodiments, this embodiment does not produce at least two effective, as-grown thicknesses for epitaxial layer 120. Instead, the at least two effective thicknesses for epitaxial layer 120 are formed after growing epitaxial layer 120.

In the embodiment illustrated in FIG. 6, a species is implanted into a portion 621 of epitaxial layer 120. An implant mask 640 can be used to shield other portions of epitaxial layer 120 and to block or otherwise prevent the species from being implanted into these other portions of epitaxial layer 120.

As an example, the specific species implanted into substrate 110 should increase the diffusion of the dopant from substrate 110 into epitaxial layer 120 during subsequent high temperature processing steps occurring after the formation of epitaxial layer 120. Prior to implanting the species into substrate 110 and prior to the subsequent high temperature processing steps, epitaxial layer 120 has a substantially uniform, effective, as-grown thickness 627, which is less than the total thickness of epitaxial layer 120. More than one species can be used for the purposes of increasing the diffusion of the dopant. Preferably, the implant does not amorphize epitaxial layer 120.

The implanted species can be used to increase the diffusion of the dopant into portion 621 of epitaxial layer 120 from the underlying portion of substrate 110. More specifically, the species can be implanted into portion 621 to increase the interstitials and/or vacancies in portion 621 of epitaxial layer 120, which increases the diffusion rate of the dopant into portion 621. After the subsequent high temperature processing steps, sections 123 of epitaxial layer are formed from portions 621 of epitaxial layer 120.

In one embodiment of FIG. 6, substrate 110 and epitaxial layer 120 are comprised of silicon; the dopant in substrate 110 and epitaxial layer 120 is boron; and the implanted species is silicon. The implant dose of the species is preferably not too high in order to prevent the formation of dislocations in epitaxial layer 120. As an example, a silicon implant dose of approximately $1 \times 10^{11}$ to $1 \times 10^{13}$ atoms per centimeter squared and a silicon implant energy of approximately 20 to 2000 keV can be used. Chain implants can also be used instead of a single implant.

After implanting the species, implant mask 640 is removed, and portions 125 and 126 of the integrated circuit (FIG. 1) are formed in sections 123 and 124 (FIG. 1), respectively, of epitaxial layer 120.

Figure 7:
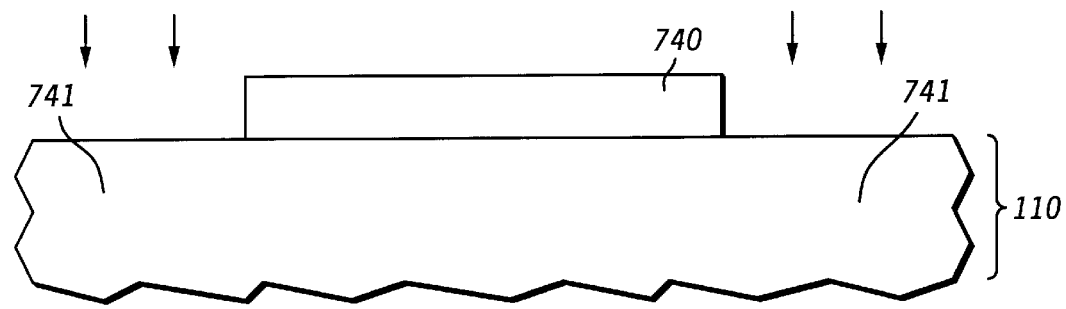
FIG. 7 illustrates a cross-sectional view of the semiconductor component of FIG. 1 during a manufacturing step, in accordance with yet another embodiment of the invention.

FIG. 7 illustrates a cross-sectional view of yet another embodiment of the semiconductor component of FIG. 1 during a manufacturing step used to increase the diffusion from an underlying substrate into an overlying epitaxial layer. In the embodiment illustrated in FIG. 7, a species is implanted into a portion 741 of substrate 110. An implant mask 740 can be used to shield other portions of substrate 110 and to block or otherwise prevent the species from being implanted into these other portions of substrate 110. As an example, this implant step can occur before inserting substrate 110 into the chamber to grow the epitaxial layer.

In this embodiment, the species is different than, but is of the same doping type as, the dopant in substrate 110. Consequently, the species implanted into portion 741 of substrate 110 increases the doping concentration in portion 741 of substrate 110 and increases the cumulative amount of dopant/species available for diffusion into the overlying portions of epitaxial layer 120 (FIG. 1). Also in this embodiment, the species has a faster diffusion rate from substrate 110 into epitaxial layer 120 (FIG. 1) than the dopant. More than one species can be used for the purposes of increasing the diffusion into the epitaxial layer. Preferably, the implant does not amorphize substrate 110.

As an example, substrate 110 and epitaxial layer 120 can be comprised of silicon; the dopant in substrate 110 and epitaxial layer 120 can be comprised of boron; and the implanted species can be comprised of aluminum or gallium. The implant dose of the species is preferably not too high in order to prevent the formation of dislocations in substrate 110. As an example, an implant dose of approximately $5 \times 10^{14}$ to $5 \times 10^{15}$ atoms per centimeter squared and an implant energy of approximately 5 to 40 keV can be used.

After implanting the species, implant mask 740 is removed, and epitaxial layer 120 (FIG. 1) is formed such that both the dopant and the species are diffused into epitaxial layer 120. Accordingly, section 123 (FIG. 1) of epitaxial layer 120 is formed over portion 741 of substrate 110. Subsequently, portions 125 and 126 of the integrated circuit (FIG. 1) are formed in sections 123 and 124 (FIG. 1), respectively, of epitaxial layer 120.

In a different embodiment, the implanted species is the same as the dopant in substrate 110. Consequently, the additional dopant implanted into portion 741 of substrate 110 increases the doping concentration in portion 741 of substrate 10 and increases the cumulative amount of dopant available for diffusion into the overlying portions of epitaxial layer 120 (FIG. 1).

Figure 8:
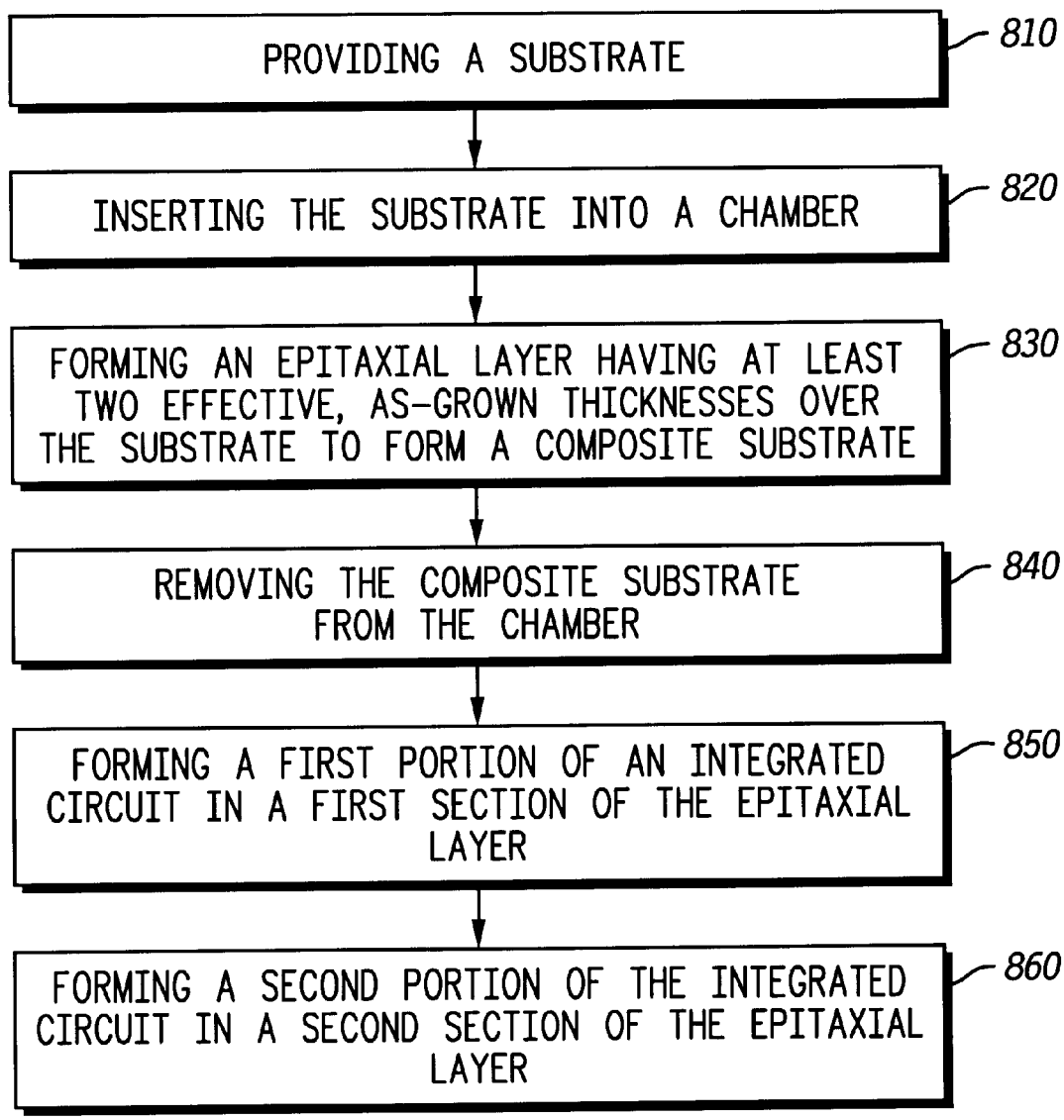
FIG. 8 illustrates a flow chart of a method of manufacturing a semiconductor component in accordance with an embodiment of the invention.

FIG. 8 illustrates a flow chart 800 of a method of manufacturing a semiconductor component in accordance with an embodiment of the invention. As an example, the semiconductor component of flow chart 800 can be similar to semiconductor components 100 and 400 in FIGS. 1 and 5, respectively. At a step 810 of flow chart 800 in FIG. 8, a substrate is provided. As an example, the substrate of step 810 in FIG. 8 can be similar to substrate 110 in FIG. 1.

Next, at a step 820 of flow chart 800 in FIG. 8, the substrate is inserted into a chamber, and at a step 830, an epitaxial layer is formed over the substrate to form a composite substrate. As an example, the epitaxial layer of step 830 in FIG. 8 can be similar to epitaxial layers 120 and 520 in FIGS. 1 and 5, respectively.

Then, at a step 840 of flow chart 800 in FIG. 8, the composite substrate is removed from the chamber. Subsequently, at a step 850, a first portion of an integrated circuit is formed n a first section of the epitaxial layer, and at a step 860, a second portion of the integrated circuit is formed in a second section of the epitaxial layer. Steps 850 and 860 can occur simultaneously with each other.

Therefore, an improved method of manufacturing a semiconductor component and semiconductor component thereof is provided to overcome the disadvantages of the prior art. An epitaxial layer in which at least a portion of the semiconductor component is formed has at least two effective thicknesses. Consequently, the semiconductor component can be resistant to latch-up and minority carrier-related problems while still having high breakdown voltages. Therefore, the semiconductor component can include logic, memory, analog, and power subcircuits in an integrated circuit located on a single semiconductor chip. Implementation of the method can be accomplished by adding an extra implant step.

Although the invention has been described with reference to specific embodiments, it will be understood by those skilled in the art that various changes may be made without departing from the spirit or scope of the invention. For instance, the numerous details set forth herein such as, for example, the material compositions, the implant conditions, and the doping concentrations are provided to facilitate the understanding of the invention and are not provided to limit the scope of the invention. As another example, the method can be used to manufacture discrete transistors having different breakdown voltages on different parts of the same semiconductor wafer. Furthermore, if, for example, three effective thicknesses are desired in the epitaxial layer, two implants can be used. Accordingly, the disclosure of embodiments of the invention is intended to be illustrative of the scope of the invention and is not intended to be limiting. It is intended that the scope of the invention shall be limited only to the extent required by the appended claims.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Furthermore, the terms "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A method of manufacturing a semiconductor component comprising:
   providing a substrate having a first doping concentration; and
   growing an epitaxial layer over the substrate, wherein:
      the epitaxial layer has a second doping concentration lower than the first doping concentration;
      the epitaxial layer comprises a first section having a first effective, as grown thickness and a second section having a second effective, as grown thickness;
      the first section is absent between the second section and the substrate; and
      the second section is absent between the first section and the substrate.

2. The method of claim 1 wherein:
   the second doping concentration in the epitaxial layer is as-grown.

3. A method of manufacturing a semiconductor component comprising:
   providing a substrate having a first doping concentration; and
   growing an epitaxial layer over the substrate, wherein:
      the epitaxial layer has a second doping concentration lower than the first doping concentration;
      the epitaxial layer has at least two effective, as-grown thicknesses;
      growing the epitaxial layer further comprises:
         diffusing a dopant from the substrate into the epitaxial layer;
      diffusing the dopant further comprises:
         decreasing diffusion of the dopant from the substrate into a portion of the epitaxial layer; and
      the dopant in the substrate- provides the first doping concentration for the substrate.

4. The method of claim 3 wherein:
   decreasing the diffusion of the dopant from the substrate into the portion of the epitaxial layer increases an effective, as-grown thickness of the portion of the epitaxial layer, the effective, as-grown thickness being one of the at least two effective, as-grown thicknesses.

5. The method of claim 3 further comprising:
   implanting a species into a portion of the substrate, wherein:
      the portion of the epitaxial layer overlies the portion of the substrate;
      decreasing the diffusion of the dopant further comprises:
         using the implanting step to retard the diffusion of the dopant from the substrate into the portion of the epitaxial layer; and
      an effective, as-grown thickness of the portion of the epitaxial layer, which is one of the at least two effective, as-grown thicknesses, is greater than an effective, as-grown thickness of a different portion of the epitaxial layer, which is another one of the at least two effective, as-grown thicknesses.

6. The method of claim 5 wherein:
   implanting the species occurs before growing the epitaxial layer.

7. The method of claim 5 wherein:
   growing the epitaxial layer further comprises:
      growing a first portion of a total thickness of the epitaxial layer before implanting the species; and
      growing a second portion of the total thickness of the epitaxial layer after implanting the species.

8. The method of claim 7 wherein:
   implanting the species further comprises:
      amorphizing the portion of the substrate; and
      keeping the first portion of the total thickness of the epitaxial layer substantially epitaxial.

9. A method of manufacturing a semiconductor component comprising:
   providing a substrate having a first doping concentration;
   growing an epitaxial layer over the substrate; and
   implanting a species into a portion of the substrate, wherein:
      the epitaxial layer has a second doping concentration lower than the first doping concentration;
      the epitaxial layer has at least two effective, as-grown thicknesses;
      a dopant in the substrate provides the first doping concentration for the substrate;
      the species increases the first doping concentration in the portion of the substrate;
      a portion of the epitaxial layer overlies the portion of the substrate;
      growing the epitaxial layer further comprises:
         diffusing the dopant and the species into the epitaxial layer;
      the species has a faster diffusion rate from the substrate into the portion of the epitaxial layer than the dopant; and
      an effective, as-grown thickness of the portion of the epitaxial layer, which is one of the at least two effective, as-grown thicknesses, is smaller than an effective, as-grown thickness of a different-portion of the epitaxial layer, which is another one of the at least two effective, as-grown thicknesses.

10. A method of manufacturing a semiconductor component comprising:
    providing a substrate having a first doping concentration;
    growing an epitaxial layer over the substrate; and
    implanting a dopant into a portion of the substrate, wherein:
       the epitaxial layer has a second doping concentration lower than the first doping concentration;
       the epitaxial layer has at least two effective, as-grown thicknesses;
       an amount of the dopant is in the substrate before implanting the dopant into the portion of the substrate;
       the amount of the dopant in the substrate provides the first doping concentration for the substrate;
       a portion of the epitaxial layer overlies the portion of the substrate;
       growing the epitaxial layer further comprises:
          diffusing the dopant into the epitaxial layer; and
       an effective, as-grown thickness of the portion of the epitaxial layer, which is one of the at least two effective, as-grown thicknesses, is smaller than an effective, as-grown thickness of a different portion of the epitaxial layer, which is another one of the at least two effective, as-grown thicknesses.

11. A semiconductor component manufactured by the method of claim 1.

12. A method of manufacturing a semiconductor component comprising:
providing a substrate having a first doping concentration; and
growing an epitaxial layer over the substrate, wherein:
the epitaxial layer has a second doping concentration lower than the first doping concentration;
growing the epitaxial layer further comprises:
diffusing a dopant from the substrate into the epitaxial layer;
diffusing the dopant further comprises:
increasing diffusion of the dopant from the substrate into a portion of the epitaxial layer to create an effective thickness in the portion of the epitaxial layer and to create a different effective thickness in a different portion of the epitaxial layer;
the portion of the epitaxial layer is absent between the different portion of the epitaxial layer and the substrate;
the different portion of the epitaxial layer is absent between the portion of the epitaxial layer and the substrate, and
the dopant in the substrate provides the first doping concentration for the substrate.

13. The method of claim 12 wherein:
increasing the diffusion of the dopant from the substrate into the portion of the epitaxial layer reduces the effective thickness of the portion of the epitaxial layer compared to the different effective thickness of the different portion of the epitaxial layer.

14. The method of claim 12 further comprising:
implanting a species into the portion of the epitaxial layer, wherein:
increasing the diffusion of the dopant further comprises:
using the implanting step to accelerate the diffusion of the dopant from the substrate into the portion of the epitaxial layer; and
the effective thickness of the portion of the epitaxial layer is smaller than the different effective thickness of the different portion of the epitaxial layer.

15. A semiconductor component manufactured by the method of claim 12.

16. A method of manufacturing a semiconductor component comprising:
providing a semiconductor substrate comprised of silicon;
inserting the semiconductor substrate into a chamber;
growing an epitaxial layer comprised of silicon over the semiconductor substrate to form a composite substrate in the chamber;
removing the composite substrate from the chamber;
forming a first portion of an integrated circuit in a first section of the epitaxial layer; and
forming a second portion of the integrated circuit in a second section of the epitaxial layer, wherein:
the epitaxial layer has at least two effective thicknesses;
the first section of the epitaxial layer has a first one of the at least two effective thicknesses;
the second section of the epitaxial layer has a second one of the at least two effective thicknesses;
the first one of the at least two effective thicknesses is greater than the second one of the at least two effective thicknesses;
the semiconductor substrate has a first doping concentration of a first dopant before inserting the semiconductor substrate into the chamber;
the epitaxial layer has a second doping concentration of the first dopant before removing the composite substrate from the chamber;
growing the epitaxial layer further comprises:
diffusing the first dopant from the semiconductor substrate into the epitaxial layer; and
the first portion of the integrated circuit is a higher voltage portion than the second portion of the integrated circuit.

17. The method of claim 16 wherein:
diffusing the first dopant further comprises:
reducing a diffusion of the first dopant from the semiconductor substrate into the first section of the epitaxial layer while growing the epitaxial layer.

18. The method of claim 17 further comprising:
implanting a species into a portion of the semiconductor substrate before inserting the semiconductor substrate into the chamber to reduce the diffusion of the first dopant from the portion of the semiconductor substrate into the first section of the epitaxial layer, wherein:
the first section of the epitaxial layer overlies the portion of the semiconductor substrate.

19. The method of claim 17 further comprising:
implanting a species into a portion of the semiconductor substrate after growing a first portion of a total thickness of the epitaxial layer, wherein:
growing the epitaxial layer further comprises:
growing the first portion of the total thickness of the epitaxial layer before implanting the species; and
growing a second portion of the total thickness of the epitaxial layer after implanting the species; and
reducing the diffusion of the first dopant further comprises:
using the implanting step to reduce the diffusion of the first dopant from the portion of the semiconductor substrate into the first section of the epitaxial layer while growing the second portion of the total thickness of the epitaxial layer.

20. The method of claim 19 wherein:
implanting the species further comprises:
amorphizing the portion of the semiconductor substrate; and
keeping the first portion of the total thickness of the epitaxial layer substantially epitaxial.

21. The method of claim 16 wherein:
diffusing the first dopant further comprises:
increasing a diffusion of the first dopant from the semiconductor substrate into the second section of the epitaxial layer while growing the epitaxial layer.

22. The method of claim 21 further comprising:
implanting a species into the second section of the epitaxial layer to accelerate the diffusion of the first dopant from the semiconductor substrate into the second section of the epitaxial layer after growing the epitaxial layer.

23. The method of claim 16 further comprising:

implanting a species into a portion of the semiconductor substrate, wherein:
- the species is an other first dopant for the semiconductor substrate;
- growing the epitaxial layer further comprises:
  - diffusing the species from the portion of the semiconductor substrate into the epitaxial layer;
- the species has a faster diffusion rate from the semiconductor substrate into the epitaxial layer than the first dopant; and
- the second section of the epitaxial layer overlies the portion of the semiconductor substrate.

24. The method of claim 16 further comprising:

implanting an additional amount of the first dopant into a portion of the semiconductor substrate, wherein:
- the first dopant in the semiconductor substrate before implanting the additional amount of the first dopant provides the first doping concentration for the semiconductor substrate; and
- the second section of the epitaxial layer overlies the portion of the semiconductor substrate.

25. The method of claim 16 wherein:
- the first dopant is a P-type dopant;
- the first doping concentration of the first dopant in the semiconductor substrate is greater than approximately $1 \times 10^{18}$ atoms per centimeter cubed before inserting the semiconductor substrate into the chamber; and
- the second doping concentration of the first dopant in the epitaxial layer is less than approximately $1 \times 10^{17}$ atoms per centimeter cubed before removing the composite substrate from the chamber.

26. A semiconductor component manufactured by the method of claim 16.

27. A semiconductor component manufactured by the method of claim 3.

28. A semiconductor component manufactured by the method of claim 9.

29. A semiconductor component manufactured by the method of claim 10.

* * * * *